United States Patent
Ueda et al.

(10) Patent No.: US 12,378,471 B2
(45) Date of Patent: Aug. 5, 2025

(54) PHOSPHOR, LIGHT-EMITTING DEVICE, ILLUMINATION DEVICE, IMAGE DISPLAY DEVICE, AND INDICATOR LAMP FOR VEHICLE

(71) Applicants: Mitsubishi Chemical Corporation, Tokyo (JP); National Institute for Materials Science, Tsukuba (JP)

(72) Inventors: Kyota Ueda, Tokyo (JP); Tomoyuki Kurushima, Tokyo (JP); Atsushi Ooishi, Tokyo (JP); Naoto Hirosaki, Ibaraki (JP)

(73) Assignees: Mitsubishi Chemical Corporation, Tokyo (JP); National Institute for Materials Science, Tsukuba (JP)

( * ) Notice: Subject to any disclaimer, the term of this patent is extended or adjusted under 35 U.S.C. 154(b) by 0 days.

(21) Appl. No.: 18/786,894

(22) Filed: Jul. 29, 2024

(65) Prior Publication Data
US 2024/0384167 A1 Nov. 21, 2024

Related U.S. Application Data (63) Continuation of application No. PCT/JP2023/047131, filed on Dec. 27, 2023.

(30) Foreign Application Priority Data

Feb. 6, 2023 (JP) .................. 2023-016168

(51) Int. Cl.
*C09K 11/77* (2006.01)
*C01B 21/082* (2006.01)
(Continued)

(52) U.S. Cl.
CPC .... *C09K 11/77346* (2021.01); *C01B 21/0825* (2013.01); *F21S 43/14* (2018.01);
(Continued)

(58) Field of Classification Search
CPC ............ C09K 11/7728; C09K 11/7734; C09K 11/77344; C09K 11/77
See application file for complete search history.

(56) References Cited

U.S. PATENT DOCUMENTS

2015/0123155 A1* 5/2015 Schmidt ................ H01L 33/502
252/301.4 F
2016/0115384 A1* 4/2016 Todorov ........... C09K 11/77346
313/503

(Continued)

FOREIGN PATENT DOCUMENTS

JP 2015-526532 9/2015

OTHER PUBLICATIONS

Pust. Narrow band red emitting Sr[LiAl3N4]:Eu2+ as a next generation LED phosphor material. Nature Materials vol. 13, pp. 891-896 (2014) (Year: 2014).*

(Continued)

*Primary Examiner* — Matthew E. Hoban
(74) *Attorney, Agent, or Firm* — Grüneberg and Myers PLLC (57) ABSTRACT

A phosphor includes a crystal phase having a composition represented by $Re^xMA^aMB^bMC^cD^dX^e$, in which MA includes at least one of Ca, Sr, Ba, Na, K, Y, Gd, or La, MB includes at least one of Li, Mg, or Zn, MC includes at least one of Al, Si, Ga, In, or Sc, D is N (nitrogen) and/or O (oxygen), X includes at least one of F, Cl, Br, or I, Re includes at least one of Eu, Ce, Pr, Tb, or Dy, and a, b, c, d, e, and x satisfy the specific expressions, respectively. In the phosphor, when a content of B (boron) is designated as b (mass ppm), a value of $Log_{10}(b)$ is 3.5 or less.

20 Claims, 1 Drawing Sheet

(51) Int. Cl.
*F21S 43/14* (2018.01)
*G02F 1/13357* (2006.01)
*H10H 20/851* (2025.01)

(52) U.S. Cl.
CPC ... *G02F 1/133603* (2013.01); *H10H 20/8513* (2025.01); *C01P 2002/52* (2013.01); *C01P 2002/76* (2013.01); *C01P 2006/60* (2013.01)

(56) References Cited

U.S. PATENT DOCUMENTS

2016/0356453 A1* 12/2016 Ji ............................. F21K 9/23
2018/0171221 A1* 6/2018 Wakui ................ C09K 11/7728

OTHER PUBLICATIONS

Cui et al., "Synthesis, structure and luminescence of $SrLiAl_3N_4:Ce^{3+}$ phosphor", Journal of luminescence, vol. 199, Mar. 15, 2018, pp. 271-277.
Fang et al., "Chemical Control of $SrLi(Al_{1-x}Ga_x)_3N_4:Eu^{2+}$ Red Phosphors at Extreme Conditions for Application in Light-Emitting Diodes", Chem. Mater., vol. 31, May 28, 2019, pp. 4614-4618.
International Search Report received for PCT Application No. PCT/JP2023/047131, mailed on Feb. 20, 2024, 3 pages.
Japanese Office Action received for Japanese Patent Application No. 2023- 016168, mailed on Apr. 25, 2023, 5 pages with English translation.
Written Opinion received for PCT Application No. PCT/JP2023/047131, mailed on Feb. 20, 2024, 9 pages with English translation.
Zhang et al., "Facile Atmospheric Pressure Synthesis of High Thermal Stability and Narrow-Band Red-Emitting $SrLiAl_3N_4:Eu^{2+}$ Phosphor for High Color Rendering Index White Light-Emitting Diodes", ACS Appl. Mater. Interfaces, vol. 8, Jul. 12, 2016, pp. 19612-19617.

* cited by examiner

PHOSPHOR, LIGHT-EMITTING DEVICE, ILLUMINATION DEVICE, IMAGE DISPLAY DEVICE, AND INDICATOR LAMP FOR VEHICLE

CROSS-REFERENCE TO RELATED APPLICATIONS

This application is a continuation of International Application No. PCT/JP2023/047131, filed on Dec. 27, 2023, and claims the benefit of priority to Japanese Application No. 2023-016168, filed on Feb. 6, 2023. The content of each of these applications is hereby incorporated by reference in its entirety.

TECHNICAL FIELD

The present invention relates to a phosphor, a light-emitting device, an illumination device, an image display device, and an indicator lamp for a vehicle.

BACKGROUND ART

In recent years, there has been a turn toward energy-saving, and demand for illumination and backlighting using LEDs is increasing. The LEDs used in these cases are white light-emitting LEDs in which a phosphor is arranged on an LED chip that emits light in a blue or near ultraviolet wavelength.

An LED using, on a blue LED chip, a nitride phosphor that emits red light and a phosphor that emits green light, with blue light from the blue LED chip as excitation light, has been used for such a type of white light-emitting LED in recent years. Higher emission efficiency for LEDs is sought, and a phosphor having superior light emission characteristics even as a red phosphor and a light-emitting device including such a phosphor are desired.

As a red phosphor that is used in the light-emitting device, a KSF phosphor represented by general formulas $K_2(Si, Ti)F_6:Mn$ and $K_2Si_{1-x}Na_xAl_xF_6:Mn$ (0<x<1), an S/CASN phosphor represented by a general formula $(Sr, Ca)AlSiN_3:Eu$, and the like are known examples, but since the KSF phosphor is harmful as a Mn-activated compound, a phosphor that is better for humans and the environment is sought. In addition, many S/CASN phosphors have comparatively broad half widths in the emission spectrum (hereinafter, may be described as "spectrum half width", "a full width at half maximum", or "FWHM") of about 80 nm to 90 nm, and an emission wavelength region is likely to include a wavelength region with low luminosity function, and therefore form the viewpoint of improving conversion efficiency, a red phosphor with a narrower spectrum half width is sought.

In addition, as a red phosphor that can be applied to light-emitting devices in recent years, for example, a phosphor represented by a composition formula $SrLiAl_3N_4:Eu$ is disclosed in an embodiment in Patent Literature 1.

CITATION LIST

Patent Literature

Patent Literature 1: Japanese Patent No. 6335884

SUMMARY OF INVENTION

Technical Problem

However, in the phosphor disclosed in Patent Literature 1, there is a possibility that boron is mixed into the phosphor by using a boron nitride crucible, and the light emission characteristics deteriorate. On the other hand, in recent years, there have been demands for a phosphor having more favorable emission intensity and a light-emitting device having favorable conversion efficiency based on a more precise compound design.

In view of the above problems, an object of the present invention is to provide a phosphor having a favorable emission peak wavelength, a narrow spectrum half width, and high emission intensity.

In addition, an object of the present invention is to provide a light-emitting device, an illumination device, an image display device, and/or an indicator lamp for a vehicle, which have favorable color rendering, color reproducibility, and/or conversion efficiency.

Solution to Problem

As a result of intensive studies, the present inventors have found that the above problems can be solved by using a phosphor including a crystal phase represented by a specific composition and having a content of a specific element adjusted to a certain value or less, or a light-emitting device including the phosphor, and have completed the present invention. Some non-limited embodiments are shown below.

An aspect 1 of the present invention is a phosphor including:

a crystal phase having a composition represented by formula [1] below, in which when a content of B (boron) is designated as b (mass ppm), a value of $Log_{10}(b)$ is 3.5 or less, $$Re_xMA_aMB_bMC_cD_dX_e \qquad [1]$$

(in formula [1] above,

MA includes one or more elements selected from the group consisting of Ca, Sr, Ba, Na, K, Y, Gd, and La, MB includes one or more elements selected from the group consisting of Li, Mg, and Zn, MC includes one or more elements selected from the group consisting of Al, Si, Ga, In, and Sc, D is one or more elements selected from the group consisting of N (nitrogen) and O (oxygen), X includes one or more elements selected from the group consisting of F, Cl, Br, and I, Re includes one or more elements selected from the group consisting of Eu, Ce, Pr, Tb, and Dy, and a, b, c, d, e, and x satisfy the following expressions, respectively, 0.7≤a≤1.3
0.9≤b≤1.3
c=3.0
3.2≤d≤4.8
0.0≤e≤0.2
0.0<x≤0.2).

An aspect 2 of the present invention is a phosphor including:

a crystal phase having a composition represented by formula [2] below, in which when a content of B (boron) is designated as b (mass ppm), a value of $Log_{10}(b)$ is 3.5 or less, $$Re_xMA_aMB_b(Al_{1-y}MC'_y)_cD_dX_e \qquad [2]$$

(in formula [2] above,

MA includes one or more elements selected from the group consisting of Ca, Sr, Ba, Na, K, Y, Gd, and La, MB includes one or more elements selected from the group consisting of Li, Mg, and Zn, MC' includes one or more elements selected from the group consisting of Si, Ga, In, and Sc, D is one or more elements selected from the group consisting of N (nitrogen) and O (oxygen), X includes one or more elements selected from the group consisting of F, Cl, Br, and I, Re includes one or more elements selected from the group consisting of Eu, Ce, Pr, Tb, and Dy, and a, b, c, d, e, x, and y satisfy the following expressions, respectively, $0.7 \leq a \leq 1.3$
$0.9 \leq b \leq 1.3$
$c=3.0$
$3.2 \leq d \leq 4.8$
$0.0 \leq e \leq 0.2$
$0.0 < x \leq 0.2$
$0.0 < y \leq 1.0$).

An aspect 3 of the present invention is the phosphor according to the aspect 1 or 2, in which
when the content of B (boron) is designated as b (mass ppm), the value of $Log_{10}(b)$ is 3.0 or less.

An aspect 4 of the present invention is the phosphor according to any one of the aspects 1 to 3, in which
in the formula [1] or the formula [2], 80 mol % or more of MA is one or more elements selected from the group consisting of Ca, Sr, and Ba.

An aspect 5 of the present invention is the phosphor according to any one of the aspects 1 to 4, in which
in the formula [1] or the formula [2], 80 mol % or more of MB is Li.

An aspect 6 of the present invention is the phosphor according to any one of the aspects 1 and 3 to 5, in which
in the formula [1], 80 mol % or more of MC consists of one or more elements selected from the group consisting of Al and Ga.

An aspect 7 of the present invention is the phosphor according to any one of the aspects 1 and 3 to 6, in which
in the formula [1], 80 mol % or more of MC is Al.

An aspect 8 of the present invention is the phosphor according to any one of the aspects 2 to 5, in which
in the formula [2], 80 mol % or more of MC' is Ga.

An aspect 9 of the present invention is the phosphor according to any one of the aspects 1 to 8, in which
in the formula [1] or the formula [2], 80 mol % or more of Re is Eu.

An aspect 10 of the present invention is the phosphor according to any one of the aspects 1 to 9, in which
a space group of the crystal phase having the composition represented by the formula [1] or the formula [2] is P-1.

An aspect 11 of the present invention is the phosphor according to any one of the aspects 1 to 10, in which
the phosphor has an emission peak wavelength in a range of 620 nm or more and 660 nm or less in an emission spectrum.

An aspect 12 of the present invention is the phosphor according to any one of the aspects 1 to 11, in which
a full width at half maximum (FWHM) in an emission spectrum is 70 nm or less.

An aspect 13 of the present invention is a light-emitting device including:
a first light emitter, and
a second light emitter including at least one phosphor that emits visible light when irradiated with light from the first light emitter, in which
the second light emitter includes the phosphor according to any one of the aspects 1 to 12.

An aspect 14 of the present invention is the light-emitting device according to the aspect 13, in which
the second light emitter further includes a yellow phosphor and/or a green phosphor.

An aspect 15 of the present invention is the light-emitting device according to the aspect 14, in which
the yellow phosphor and/or the green phosphor include any one or more of a garnet-based phosphor, a silicate-based phosphor, a nitride phosphor, and an oxynitride phosphor.

An aspect 16 of the present invention is an illumination device including:
the light-emitting device according to any one of the aspects 13 to 15 as a light source.

An aspect 17 of the present invention is an image display device including:
the light-emitting device according to any one of the aspects 13 to 15 as a light source.

An aspect 18 of the present invention is an indicator lamp for a vehicle including:
the light-emitting device according to any one of the aspects 13 to 15 as a light source.

ADVANTAGEOUS EFFECTS OF INVENTION

According to the present invention, it is possible to provide a phosphor having a favorable emission peak wavelength, a narrow spectrum half width, and high emission intensity.

In addition, according to the present invention, it is possible to provide a light-emitting device, an illumination device, an image display device, and/or an indicator lamp for a vehicle, which have favorable color rendering, color reproducibility, and/or conversion efficiency.

DESCRIPTION OF EMBODIMENTS

Figure 1:
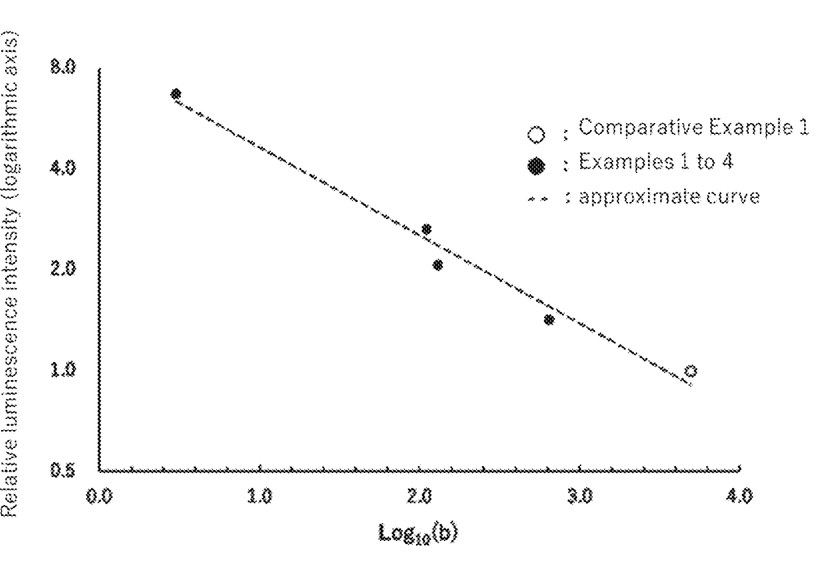
FIGURE is a diagram in which a value of $Log_{10}(b)$ when a content of B (boron) in phosphors of Comparative Example 1 and Examples 1 to 4 is designated as b (mass ppm) is plotted on a horizontal axis, and relative luminance of the phosphors of Comparative Example 1 and Examples 1 to 4 when luminance of Comparative Example 1 is 1.0 is plotted on a vertical axis.

Hereinafter, the present invention is described by way of embodiments and illustrative examples, but the present invention is not limited to the following embodiments, illustrative examples, or the like, and can be implemented by making any desired modification within the scope of the gist of the present invention.

Note that in the present description, a numerical range expressed using "to" means a range which includes numerical values written before and after "to" as an upper limit value and a lower limit value. In addition, in a composition formula of a phosphor in the present description, the end of each composition formula is delimited by a comma (,). Further, in a case where a plurality of elements are listed delimited by a comma (,), this indicates that one or two or more of the listed elements may be contained in any combination and composition. For example, a composition formula "(Ca, Sr, Ba) $Al_2O_4$:Eu" comprehensively represents "$CaAl_2O_4$:Eu", "$SrAl_2O_4$:Eu", "$BaAl_2O_4$:Eu", "$Ca_{1-x}Sr_xAl_2O_4$:Eu", "$Sr_{1-x}Ba_xAl_2O_4$:Eu", "$Ca_{1-x}Ba_xAl_2O_4$:Eu", and "$Ca_{1-x-y}Sr_xBa_yAl_2O_4$:Eu" (where $0<x<1$, $0<y<1$, and $0<x+y<1$).

Phosphor

In one embodiment, the present invention is a phosphor including a crystal phase having a composition represented by formula [1] below, in which when a content of B (boron) is designated as b (mass ppm), a value of $\log_{10}(b)$ is 3.5 or less (hereinafter, may be referred to as "phosphor [1] according to the present embodiment").

(in formula [1] above,
MA includes one or more elements selected from the group consisting of Ca, Sr, Ba, Na, K, Y, Gd, and La,
MB includes one or more elements selected from the group consisting of Li, Mg, and Zn,
MC includes one or more elements selected from the group consisting of Al, Si, Ga, In, and Sc,
D is one or more elements selected from the group consisting of N (nitrogen) and O (oxygen),
X includes one or more elements selected from the group consisting of F, Cl, Br, and I,
Re includes one or more elements selected from the group consisting of Eu, Ce, Pr, Tb, and Dy, and
a, b, c, d, e, and x satisfy the following expressions, respectively,
$0.7 \leq a \leq 1.3$
$0.9 \leq b \leq 1.3$
$c = 3.0$
$3.2 \leq d \leq 4.8$
$0.0 \leq e \leq 0.2$
$0.0 < x \leq 0.2$).

The phosphor [1] according to the present embodiment and a phosphor [2] according to the present embodiment to be described later may be collectively referred to as a "phosphor according to the present embodiment".

In another embodiment, the present invention is a light-emitting device including the phosphor [1] according to the present embodiment.

In formula [1], as Re, europium (Eu), cerium (Ce), praseodymium (Pr), neodymium (Nd), samarium (Sm), terbium (Tb), dysprosium (Dy), holmium (Ho), erbium (Er), thulium (Tm), ytterbium (Yb), and the like can be used, but from the viewpoint of improving an emission wavelength and emission quantum efficiency, Re preferably includes one or more elements selected from the group consisting of Eu, Ce, Pr, Tb, and Dy, and more preferably includes Eu, still more preferably 80 mol % or more of Re is Eu, and even more preferably Re is Eu.

In formula [1], MA includes one or more elements selected from the group consisting of calcium (Ca), strontium (Sr), barium (Ba), sodium (Na), potassium (K), yttrium (Y), gadolinium (Gd), and lanthanum (La), preferably includes one or more elements selected from the group consisting of Ca, Sr, and Ba, and more preferably MA includes Sr. Preferably, 80 mol % or more of MA is one or more elements selected from the group consisting of Ca, Sr, and Ba, and more preferably, MA consists of one or more elements selected from the group consisting of Ca, Sr, and Ba.

In formula [1], MB includes one or more elements selected from the group consisting of lithium (Li), magnesium (Mg), and zinc (Zn), preferably includes Li, more preferably 80 mol % or more of MB is Li, and still more preferably MB is Li.

In formula [1], MC includes one or more elements selected from the group consisting of aluminum (Al), silicon (Si), gallium (Ga), indium (In), and scandium (Sc), preferably includes Al, Ga, or Si, more preferably includes one or more elements selected from the group consisting of Al and Ga, still more preferably 80 mol % or more of MC consists of one or more elements selected from the group consisting of Al and Ga, particularly preferably 90 mol % or more of MC consists of one or more elements selected from the group consisting of Al and Ga, and most preferably MC consists of one or more elements selected from the group consisting of Al and Ga.

In one embodiment, 80 mol % or more of MC is Al, preferably 90 mol % or more, more preferably 95 mol % or more, and still more preferably 98 mol % or more of MC is Al. When 80 mol % or more of MC is Al, a red phosphor exhibiting an emission peak wavelength and emission intensity comparable to those of existing red phosphors such as S/CASN and having a narrow spectrum half width can be provided. By using such a red phosphor, a light-emitting device excellent in color rendering or color reproducibility while maintaining conversion efficiency (Lm/W) equal to or higher than that of the related art can be provided. In formula [1], D is one or more elements selected from the group consisting of N (nitrogen) and O (oxygen). A proportion of N (nitrogen) in D can be freely adjusted, and is preferably 50 mol % or more, more preferably 70 mol % or more, still more preferably 80 mol % or more, and may be 100 mol % or more. By appropriately adjusting the proportion of N (nitrogen) in D, a charge balance of the entire crystal phase can be maintained or the emission peak wavelength can be adjusted.

In formula [1], X includes one or more elements selected from the group consisting of fluorine (F), chlorine (Cl), bromine (Br), and iodine (I). That is, in a specific embodiment, from the viewpoint of stabilizing a crystal structure and maintaining a charge balance of the entire phosphor, N in the above D may be partially substituted with the above halogen element represented by X.

When the content of B (boron) in the phosphor [1] according to the present embodiment is designated as b (mass ppm), the value of $\log_{10}(b)$ is generally 3.5 or less, preferably 3.0 or less, more preferably 2.5 or less, and still more preferably 2.2 or less. A lower limit of $\log_{10}(b)$ is not particularly limited, and is preferably as small as possible, and may be a negative value. A negative value of $\log_{10}(b)$ indicates that the content of boron is less than 1 ppm.

When the value of $\log_{10}(b)$ is a value equal to or lower than the above upper limit, the emission intensity of the phosphor can be improved.

A method of setting the value of $\log_{10}(b)$ to a value equal to or lower than the above upper limit is not particularly limited as long as an effect of the present invention is not lost. In a specific embodiment, a method of dispersing or attaching an element different from boron or a compound thereof to raw material mixed powder, a method of coating a surface of a reaction vessel with the element different from boron or the compound thereof, a method of executing synthesis using a reaction vessel made of a material containing the element different from boron or the compound thereof, and the like can be adopted.

The element different from boron is not limited as long as the effect of the invention is obtained, and an element that can be used as a material of a crucible can be used, and in one embodiment, the element different from boron includes one or more elements selected from the group consisting of Mo, W, Nb, Ta, Ni, Pt, and Ir, preferably includes one or more elements selected from the group consisting of Mo, W, Nb, Ta, and Ni, and more preferably includes Mo.

In examples to be described later, Mo was used as an example.

The reason why the phosphor according to the present embodiment exhibits favorable luminance, spectrum half width, and/or emission intensity is unclear, but it is considered that mixing of boron may cause a generation of a phase having poor light emission characteristics, and by preventing this, the light emission characteristics are improved.

Formula [1] above and formula [2] to be described later may contain a component other than those specified above as long as the effect of the present invention is not impaired.

Examples of a component other than those specified above include an element having an element number that is one or two different from that of any element constituting formula [1] above and formula [2] to be described later, a homologous element of an intentionally added element, another rare earth element different from an intentionally added rare earth element, a halogen element when a halide is used as a raw material, and elements that can be generally contained as impurities in various other raw materials.

Examples of the case where a component other than those specified above are contained include a case where an element other than those specified above is contained in any site of MA, MB, MC, and D, as well as MC', X, and Re to be described later for the purpose of exhibiting a new effect, and a case where a component other than those specified above is inevitably or unintentionally introduced, due to an impurity of a raw material and in a production process such as a pulverization step and a synthesis step. In addition, examples of components added in a trace amount include a reaction aid and raw materials.

In formula [1] above, a, b, c, d, e, and x indicate molar contents of MA, MB, MC, D, X, and Re contained in the phosphor, respectively. Ideal ratios at which the crystal structure is stabilized refer to a case where ratios of a+x, b, c, and d+e are 1, 1, 3, and 4, respectively, but in practice, values of a+x, b, c, and d+e may vary slightly from the ideal ratios due to various causes such as monoatomic deficiency, a change in composition due to oxidation of a phosphor surface, a heterogeneous phase, and charge compensation. However, the present invention does not exclude those as long as the gist of the present invention is not impaired or the effect of the present invention is not lost. Specifically, ranges of allowable numerical values of a, b, c, d, e, and x are shown below.

The value of a is generally 0.7 or more, preferably 0.8 or more, and more preferably 0.9 or more, and is generally 1.3 or less, preferably 1.2 or less, and more preferably 1.1 or less.

The value of b is generally 0.7 or more, preferably 0.8 or more, and more preferably 0.9 or more, and is generally 1.3 or less, preferably 1.2 or less, and more preferably 1.1 or less.

The value of c is generally 2.4 or more, preferably 2.6 or more, and more preferably 2.8 or more, and is generally 3.6 or less, preferably 3.4 or less, and more preferably 3.2 or less. In addition, in one embodiment, the value of c is 3.0.

The value of d is generally 3.2 or more, preferably 3.4 or more, more preferably 3.6 or more, and still more preferably 3.8 or more, and is generally 4.8 or less, preferably 4.6 or less, more preferably 4.4 or less, and still more preferably 4.2 or less.

The value of e is not particularly limited, and is generally 0.0 or more, and is generally 0.2 or less, preferably 0.1 or less, more preferably 0.06 or less, still more preferably 0.04 or less, and even more preferably 0.02 or less.

The value of x is generally greater than 0.0, preferably 0.0001 or more, and more preferably 0.001 or more, and is generally 0.2 or less, preferably 0.15 or less, more preferably 0.12 or less, still more preferably 0.1 or less, and even more preferably 0.08 or less. When the value of x is a value equal to or greater than the above lower limit or greater than the above lower limit, a phosphor having favorable emission intensity can be obtained, and when the value of x is equal to or lower than the above upper limit, a phosphor in which Re can be favorably incorporated in a crystal and which easily functions as an emission center can be obtained.

When b, c, d, and e are within the above ranges, the crystal structure is stabilized. In addition, the values of d and e can be appropriately adjusted for the purpose of maintaining the charge balance of the entire phosphor.

Further, when the value of a is within the above range, the crystal structure is stabilized and a phosphor with few heterogeneous phases can be obtained.

A value of b+c is generally 3.1 or more, preferably 3.4 or more, and more preferably 3.7 or more, and is generally 4.9 or less, preferably 4.6 or less, and more preferably 4.3 or less. In addition, in one embodiment, the value of b+c is 3.9 or more and 4.3 or less.

When the value of b+c is within the above range, the crystal structure is stabilized.

The value of d+e is generally 3.2 or more, preferably 3.4 or more, and more preferably 3.7 or more, and is generally 5.0 or less, preferably 4.6 or less, and more preferably 4.3 or less.

When the value of d+e is within the above range, the crystal structure is stabilized.

When all values are within the above ranges, the resulting phosphor has a favorable emission peak wavelength and full width at half maximum in an emission spectrum, which is preferred.

Note that a method of specifying an elemental composition of the phosphor is not particularly limited, and can be found with a common method, for example, the specification can be executed with GD-MS, ICP spectroscopy, an energy-dispersive X-ray spectrometer (EDX), or the like.

In one embodiment, the present invention is a phosphor including a crystal phase having a composition represented by formula [2] below, in which when a content of B (boron) is designated as b (mass ppm), a value of $Log_{10}(b)$ is 3.5 or less (hereinafter, may be referred to as "phosphor [2] according to the present embodiment").

$$Re_xMA_aMB_b(Al_{1-y}MC'_y)D_dX_e \qquad [2]$$

(in formula [2] above,

MA includes one or more elements selected from the group consisting of Ca, Sr, Ba, Na, K, Y, Gd, and La, MB includes one or more elements selected from the group consisting of Li, Mg, and Zn, MC' includes one or more elements selected from the group consisting of Si, Ga, In, and Sc, D is one or more elements selected from the group consisting of N (nitrogen) and O (oxygen), X includes one or more elements selected from the group consisting of F, Cl, Br, and I, Re includes one or more elements selected from the group consisting of Eu, Ce, Pr, Tb, and Dy, and a, b, c, d, e, x, and y satisfy the following expressions, respectively, $0.7 \leq a \leq 1.3$
$0.9 \leq b \leq 1.3$
$c=3.0$
$3.2 \leq d \leq 4.8$
$0.0 \leq e \leq 0.2$
$0.0 < x \leq 0.2$
$0.0 < y \leq 1.0$).

In another embodiment, the present invention is a light-emitting device including the phosphor [2] according to the present embodiment.

Types and configurations of MA, MB, D, X, and Re elements in formula [2] above can be the same as in formula [1] above.

In addition, a preferable value of $Log_{10}(b)$ in the phosphor [2] according to the present embodiment and a method for producing the phosphor can be the same as those of the phosphor [1] according to the present embodiment.

In formula [2], MC' includes one or more elements selected from the group consisting of Si, Ga, In, and Sc, and from the viewpoint of improving crystal stability and emission intensity, MC' preferably includes one or more elements selected from the group consisting of Ga and Si, and more preferably includes Ga.

In a further preferred specific embodiment, 80 mol % or more of MC' in formula [2] may be Ga, or MC' may consist of Ga.

The values and preferred ranges of a, b, c, d, e, and x in formula [2] above can be the same as in formula [1] above.

The value of y in formula [2] above is greater than 0.0, generally 0.01 or more, preferably 0.015 or more, more preferably 0.03 or more, still more preferably 0.05 or more, and particularly preferably 0.1 or more, and is generally 1.0 or less, preferably 0.7 or less, more preferably 0.5 or less, still more preferably 0.3 or less, and particularly preferably 0.25 or less.

When the value of y is a value equal to or greater than the above lower limit or greater than the lower limit, the emission peak wavelength of the phosphor becomes shorter, and when such a phosphor is used, a light-emitting device having favorable color rendering or color reproducibility can be provided. In addition, when the value of y is equal to or lower than the above upper limit, a phosphor having favorable emission intensity can be obtained, and when such a phosphor is used, a light-emitting device having favorable conversion efficiency can be provided. In order to obtain preferred emission intensity and emission peak wavelength depending on the purpose, the value of y can be appropriately adjusted.

Particle Size of Crystal Phase

The particle size of the crystal phase of the phosphor according to the present embodiment is generally 2 μm or more and 35 μm or less in terms of a volume-based median particle size (volume median particle size), a lower limit value thereof is preferably 3 μm or more, more preferably 4 μm or more, and still more preferably 5 μm or more, and an upper limit value thereof is preferably 30 μm or less, more preferably 25 μm or less, still more preferably 20 μm or less, and particularly preferably 15 μm or less.

It is preferable that the volume-based median particle size (volume median particle size) is equal to or greater than the above lower limit from the viewpoint of improving light emission characteristics exhibited by a crystal phase in an LED package, and it is preferable that the volume-based median particle size (volume median particle size) is equal to or lower than the above upper limit from the point that the crystal phase can avoid clogging of nozzles in a production step for the LED package.

The volume-based median particle size (volume median particle size) of the crystal phase of the phosphor can be measured by measurement techniques well known to those skilled in the art, and can be measured by, for example, a laser granulometer in a preferred embodiment. In examples in the present description, the volume-based median particle size (volume median particle size, ($d_{50}$) is defined as a particle size at which a volume-based relative particle amount is 50% when a sample is measured using a particle size distribution measuring device based on a measuring principle of laser diffraction/scattering and a particle size distribution (cumulative distribution) is determined.

Physical Properties and the Like of Phosphor

[Space Group]

In the phosphor according to the present embodiment, a crystal system (space group) of the crystal phase having the composition represented by formula [1] or formula [2] is not limited as long as the effect of the invention is obtained, and in one embodiment, $P4_2/m$ of a tetragonal crystal and P-1 of a monoclinic crystal can be used, and preferably the crystal system is P-1. The space group in the phosphor according to the present embodiment is not particularly limited as long as an average structure statistically considered within a distinguishable range by powder X-ray diffraction or single crystal X-ray diffraction shows a repeating period having the above length, and preferably belongs to No. 2 based on "International Tables for Crystallography (Third, revised edition), Volume A SPACE-GROUP SYMMETRY".

With the above space group, a full width at half maximum (FWHM) in the emission spectrum becomes narrower and a phosphor having favorable emission efficiency can be obtained.

Here, the space group can be determined according to a common method, for example, can be determined by electron beam diffraction, X-ray diffraction structure analysis using powder or a single crystal, neutron beam diffraction structure analysis, and the like.

Characteristics of Emission Spectrum

The phosphor according to the present embodiment is excited by irradiating the phosphor with light having an appropriate wavelength, and emits red light exhibiting a favorable emission peak wavelength and spectrum half width (FWHM) in the emission spectrum. Hereinafter, the above emission spectrum and excitation wavelength, as well as emission peak wavelength and spectrum half width (FWHM) are described.

Excitation Wavelength

The phosphor according to the present embodiment has an excitation peak in a wavelength range of generally 270 nm or more, preferably 300 nm or more, more preferably 320 nm or more, still more preferably 350 nm or more, and particularly preferably 400 nm or more, and of generally 500 nm or less, preferably 480 nm or less, and more preferably 460 nm or less. That is, the phosphor is excited by light in a near-ultraviolet to blue region.

Note that descriptions of a shape of the emission spectrum, as well as of the emission peak wavelength and the spectrum half width below are applicable regardless of the excitation wavelength, but from the viewpoint of improving quantum efficiency, irradiation with light having a wavelength within the above range with favorable absorption and excitation efficiency is preferable.

Emission Peak Wavelength

The phosphor according to the present embodiment has a peak wavelength in the emission spectrum of generally 620 nm or more, preferably 625 nm or more, and more preferably 630 nm or more. In addition, the peak wavelength in the emission spectrum is generally 670 nm or less, preferably 660 nm or less, and more preferably 655 nm or less. The phosphor according to the present embodiment can have, for example, an emission peak wavelength in a range of 620 nm or more and 660 nm or less in the emission spectrum.

When the peak wavelength in the emission spectrum of the phosphor is within the above range, a color of the emitted light is a favorable red color, and by using this phosphor, a light-emitting device having favorable color rendering or color reproducibility can be provided. In addition, when the peak wavelength in the emission spectrum of the phosphor is equal to or lower than the above upper limit, a light-emitting device having favorable luminous efficiency of the red color and favorable luminous efficacy in 1m/W can be provided.

Phosphors having different peak wavelengths according to usage can be used in the light-emitting device. A method for obtaining phosphors having different peak wavelengths is not particularly limited, and can be achieved by changing a configuration of the MC element, as an example of one method.

In one embodiment, a phosphor having a long emission peak wavelength can be obtained by using Al for MC in formula [1] above and increasing a ratio of Al. In this embodiment, the emission peak wavelength is preferably 640 nm or more, and more preferably 645 nm or more, and is generally 670 nm or less, and preferably 660 nm or less. By providing a phosphor having an emission wavelength within this range, for example, a light-emitting device that achieves both emission efficiency and color rendering can be provided as a light-emitting device used for illumination, or a light-emitting device that achieves both emission efficiency and a color reproduction range can be provided as a light-emitting device used in a backlight unit for a liquid crystal display.

In another embodiment, by providing a phosphor including a crystal phase having a composition represented by formula [2] above using Al and MC' elements, a phosphor having a relatively short emission peak wavelength can be obtained. In this embodiment, the emission peak wavelength is generally 615 nm or more, preferably 620 nm or more, more preferably 625 nm or more, and still more preferably 630 nm or more, and is generally 660 nm or less, preferably 645 nm or less, and more preferably 640 nm or less. By providing a phosphor having an emission wavelength within the above range, a light-emitting device having favorable color rendering or color reproducibility can be obtained.

Full Width at Half Maximum of Emission Spectrum

The phosphor according to the present embodiment has a full width at half maximum in the emission spectrum of generally 80 nm or less, preferably 70 nm or less, more preferably 60 nm or less, still more preferably 55 nm or less, and particularly preferably 50 nm or less, and of generally 10 nm or more.

When a phosphor having a full width at half maximum in the emission spectrum within the above range is used, a color reproduction range can be widened without reducing color purity in an image display device such as a liquid crystal display.

In addition, a phosphor having relatively high luminous efficacy of the emission wavelength region can be provided when the emission peak wavelength and the spectrum half width are equal to or lower than the above upper limits, and a light-emitting device having high conversion efficiency can be provided when such a phosphor is used in the light-emitting device.

Note that in order to excite the phosphor with light having a wavelength of about 450 nm, for example, a GaN-based LED can be used as an excitation light source. In addition, measurement of the emission spectrum of the phosphor, and calculation of the emission peak wavelength, peak relative intensity, and spectrum half width thereof can be executed using, for example, a commercially available spectrum measuring device such as a fluorescence measuring device including a generic photodetector, and a light source having an emission wavelength of 300 nm to 400 nm such as a commercially available xenon lamp.

Method for Producing Phosphor

The phosphor according to the present embodiment can be synthesized by mixing raw materials of respective elements constituting the phosphor such that proportions of the respective elements satisfy formula [1] or formula [2], followed by heating.

Phosphor Raw Material

Phosphor raw materials to be supply sources of the respective elements (MA, MB, MC, MC', and Re) are not particularly limited, and examples thereof include single substances, oxides, nitrides, hydroxides, halides such as chlorides and fluorides, inorganic salts such as sulfates, nitrates and phosphates, and organic acid salts such as acetates, of the respective elements. In addition, a compound containing two or more in the above element group may be used. In addition, each compound may be a hydrate or the like.

In examples to be described later, nitrides of respective elements were used as phosphor raw materials.

A method of obtaining each phosphor raw material is not particularly limited, and commercially available materials can be purchased and used.

Purity of each phosphor raw material is not particularly limited, but is preferably high from the viewpoint of a strict element ratio and from the viewpoint of avoiding appearance of heterogeneous phases due to impurities, and is generally 90 mol % or more, preferably 95 mol % or more, more preferably 97 mol % or more, and still more preferably 99 mol % or more, and an upper limit thereof is not particularly limited, but is generally 100 mol % or less, and unavoidable impurities may be contained.

In examples to be described later, in all cases, a phosphor raw material having a purity of 95 mol % or more was used.

The oxygen element (O), the nitrogen element (N), and the halogen element (X) can be supplied by using oxides, nitrides, halides, and the like as the phosphor raw materials to be supply sources for the above respective elements, and can be contained as appropriate by using an oxygen-or nitrogen-containing atmosphere during a synthesis reaction.

Mixing Step

A method of mixing the phosphor raw materials is not particularly limited, and a common method can be used. For example, the phosphor raw materials are weighed so as to obtain a desired composition, and sufficiently mixed using a ball mill or the like to obtain a phosphor raw material mixture. The above mixing method is not particularly limited, and specific examples thereof include the following methods (a) and (b).
(a) A dry mixing method of pulverizing and mixing the phosphor raw materials described above by combining pulverization with mixing, the pulverization using, for example, a dry pulverizer such as a hammer mill, a roll mill, a ball mill, and a jet mill, or a mortar and a pestle, and the mixing using, for example, a mixer such as a ribbon blender, a V type blender, and a Henschel mixer, or a mortar and a pestle.
(b) A wet mixing method of adding a solvent or a dispersion medium such as water to the phosphor raw materials described above, executing mixing using, for example, a pulverizer, a mortar and a pestle, or an evaporating dish and a stirring rod to bring the mixture to a solution or slurry state, and then executing drying by spray drying, heat drying, or natural drying.

The phosphor raw materials may be mixed by either the dry mixing method or the wet mixing method, but in order to avoid contamination of the phosphor raw materials with moisture, a dry mixing method or a wet mixing method using a water-insoluble solvent is preferred.

Note that in examples to be described later, the method (a) was used.

Addition of Element Different from Boron

In a specific embodiment, in the method for producing a phosphor, an element different from boron or a compound thereof may be added to the obtained phosphor raw material mixture after the mixing step.

The method of adding the element different from boron is not particularly limited as long as the element different from boron or a compound thereof is dispersed or attached to the phosphor raw material mixture, and a common method can be used. For example, a vapor phase method or a sol-gel method may be used, and the phosphor raw material mixture and the element different from boron or the compound thereof may be mixed and heat-treated. In addition, for example, the surface of the reaction vessel may be coated with the element different from boron or the compound thereof, and further, for example, the synthesis may be executed using a reaction vessel made of a material containing the element different from boron or the compound thereof.

Heating Step

In the heating step, for example, the phosphor raw material mixture obtained in the mixing step is charged into a crucible, and subsequently heated at a temperature of 500° C. to 1,200° C., and preferably 600° C. to 1,100° C.

In addition, a pressure in the heating step may be a normal pressure or a pressurized state as long as the desired phosphor is obtained, but pressurization is preferred in order to prevent volatilization of elements contained in the phosphor raw materials. In the case of pressurization, the pressure is generally 0.1 MPa or more and 200 MPa or less, and preferably 100 MPa or less. When the pressure is within the above range, favorable reactivity of the phosphor raw materials can be ensured.

A method for pressurization is not limited, and for example, a method of heating a sealed vessel, a method of mechanically applying pressure, or a method of using a gas pressure can be used.

The material of the crucible is preferably one that does not react with the phosphor raw materials or reactants, and examples thereof include ceramics such as alumina, quartz, boron nitride, silicon carbide, and silicon nitride, metals such as nickel (Ni), platinum (Pt), molybdenum (Mo), tungsten (W), tantalum (Ta), niobium (Nb), iridium (Ir), and rhodium (Rh), or an alloy containing these as a main component.

In examples to be described later, a boron nitride crucible, or a boron nitride crucible coated with an element different from boron was used.

The heating is preferably executed under an inert atmosphere, and a gas containing nitrogen, argon, helium, or the like as a main component can be used.

Note that in examples to be described later, the heating was executed under a nitrogen atmosphere.

In the heating step, the heating is executed in the above temperature range for generally 10 minutes to 200 hours, preferably 1 hour to 100 hours, and more preferably 2 hours to 50 hours. In addition, this heating step may be executed once, or may be executed a plurality of times. Examples of an aspect in which the heating step is executed a plurality of times include an aspect including an annealing step of executing heating under pressure to repair defects, and an aspect of executing primary heating for obtaining primary particles or intermediates and then executing secondary heating for obtaining secondary particles or a final product.

Accordingly, the phosphor according to the present embodiment is obtained.

Selection of Phosphor

The phosphor according to the present embodiment can generally be obtained with the above method, but depending on a minute difference such as a minute deposit in the reaction vessel, impurities of each reagent, and a lot number of each raw material reagent, the obtained phosphor may partially contain particles slightly out of the range of the requirements of the present invention, and a substance having a large particle size and a substance having a small particle size, a phosphor having a different reflectance, and the like may be mixed together.

Therefore, the phosphor according to the above embodiment can be obtained reliably by, for example, changing a number of conditions to produce a phosphor, selecting the obtained phosphor by classification, washing, and the like, analyzing the reflectance, XRD spectrum, and the like, and selecting a phosphor satisfying the requirements of the present invention.

Light-Emitting Device

According to one embodiment of the present invention, there is provided a light-emitting device including a first light emitter (excitation light source), and a second light emitter including at least one phosphor that emits visible light when irradiated with light from the first light emitter, in which the second light emitter includes the phosphor [1]

according to the present embodiment or the phosphor [2] according to the present embodiment. Here, one kind of second light emitter may be used singly, or two or more kinds second light emitters may be used together in any combination and ratio.

In the light-emitting device of the present embodiment, the second light emitter includes the phosphor according to the present embodiment including a crystal phase having a composition represented by formula [1] or formula [2] above, and may further include a phosphor that emits fluorescence in a yellow, green, or red (orange or red) region under irradiation with light from the excitation light source.

In a specific embodiment, the light-emitting device according to the present invention is a light-emitting device in which the second light emitter includes the phosphor including a crystal phase having a composition represented by formula [1] or formula [2] above and further includes a yellow phosphor and/or green phosphor.

Specifically, in a case of configuring the light-emitting device, the yellow phosphor preferably has an emission peak in a wavelength range of 550 nm or more and 600 nm or less, and the green phosphor preferably has an emission peak in a wavelength range of 500 nm or more and 560 nm or less. In addition, the phosphor of orange or red has an emission peak in a wavelength range of generally 615 nm or more, preferably 620 nm or more, more preferably 625 nm or more, and still more preferably 630 nm or more, and of generally 660 nm or less, preferably 650 nm or less, more preferably 645 nm or less, and still more preferably 640 nm or less.

When phosphors in the above wavelength regions are appropriately combined, a light-emitting device exhibiting excellent color reproducibility can be provided. Note that as for the excitation light source, a phosphor having an emission peak in a wavelength range of less than 420 nm may be used.

Hereinafter, an aspect of the light-emitting device is described in a case where, as the red phosphor, the phosphor according to the present embodiment having an emission peak in a wavelength range of 620 nm or more and 660 nm or less and including a crystal phase having a composition represented by formula [1] or formula [2] above is used, and a phosphor of which the first light emitter having an emission peak in the wavelength range of 300 nm or more and 460 nm or less is used, but the present embodiment is not limited thereto.

In the above case, the light-emitting device according to the present embodiment can be, for example, in the following aspect (A), (B), or (C).

(A) An aspect in which, as the first light emitter, a phosphor having an emission peak in a wavelength range of 300 nm or more and 460 nm or less is used, and as the second light emitter, at least one kind of phosphor having an emission peak in a wavelength range of 550 nm or more and 600 nm or less (yellow phosphor) and the phosphor according to the present embodiment including a crystal phase having a composition represented by formula [1] or formula [2] above are used.

(B) An aspect in which, as the first light emitter, a phosphor having an emission peak in a wavelength range of 300 nm or more and 460 nm or less is used, and as the second light emitter, at least one kind of phosphor having an emission peak in a wavelength range of 500 nm or more and 560 nm or less (green phosphor) and the phosphor according to the present embodiment including a crystal phase having a composition represented by formula [1] or formula [2] above are used.

(C) An aspect in which, as the first light emitter, a phosphor having an emission peak in a wavelength range of 300 nm or more and 460 nm or less is used, and as the second light emitter, at least one kind of phosphor having an emission peak in a wavelength range of 550nm or more and 600 nm or less (yellow phosphor), at least one kind of phosphor having an emission peak in a wavelength range of 500 nm or more and 560 nm or less (green phosphor), and the phosphor according to the present embodiment including a crystal phase having a composition represented by formula [1] or formula [2] above are used.

As the green phosphor or the yellow phosphor in the above aspects, a commercially available phosphor can be used, for example, a garnet-based phosphor, a silicate-based phosphor, a nitride phosphor, or an oxynitride phosphor can be used. That is, in the above aspects, the yellow phosphor and/or the green phosphor can include any one or more of a garnet-based phosphor, a silicate-based phosphor, a nitride phosphor, and an oxynitride phosphor.

Yellow Phosphor

As those can be used in the yellow phosphor, examples of the garnet-based phosphor include (Y, Gd, Lu, Tb, La)$_3$(Al, Ga)$_5$O$_{12}$:(Ce, Eu, Nd), examples of the silicate-based phosphor include (Ba, Sr, Ca, Mg)$_2$SiO$_4$:(Eu, Ce), and examples of the nitride phosphor and the oxynitride phosphor include (Ba, Ca, Mg)Si$_2$O$_2$N$_2$:Eu (SION-based phosphor), (Li, Ca)$_2$(Si, Al)$_{12}$(O, N)$_{16}$:(Ce, Eu) (α-sialon phosphor), (Ca, Sr)AlSi$_4$(O, N)$_7$:(Ce, Eu) (1147 phosphor), and (La, Ca, Y, Gd)$_3$(Al, Si)$_6$N$_{11}$:(Ce, Eu) (LSN phosphor).

One kind of these may be used singly, or two or more kinds thereof may be used in combination.

Among the above phosphors, the yellow phosphor is preferably a garnet-based phosphor, and most preferably a YAG-based phosphor represented by Y$_3$Al$_5$O$_{12}$:Ce among those.

Green Phosphor

As those can be used for the green phosphor, examples of the garnet-based phosphor include (Y, Gd, Lu, Tb, La)$_3$(Al, Ga)$_5$O$_{12}$:(Ce, Eu, Nd) and Ca$_3$(Sc, Mg)$_2$Si$_3$O$_{12}$:(Ce, Eu) (CSMS phosphor), examples of the silicate-based phosphor include (Ba, Sr, Ca, Mg)$_3$SiO$_{10}$:(Eu, Ce) and (Ba, Sr, Ca, Mg)$_2$SiO$_4$:(Ce, Eu) (BSS phosphor), examples of the oxide phosphor include (Ca, Sr, Ba, Mg)(Sc, Zn)$_2$O$_4$:(Ce, Eu) (CASO phosphor), examples of the nitride phosphor and oxynitride phosphor include (Ba, Sr, Ca, Mg)Si$_2$O$_2$N$_2$:(Eu, Ce), Si$_{6-z}$Al$_z$O$_z$N$_{8-z}$:(Eu, Ce) (β-sialon phosphor) (0<z≤1), and (Ba, Sr, Ca, Mg, La)$_3$(Si, Al)$_6$O$_{12}$N$_2$:(Eu, Ce) (BSON phosphor), and examples of the aluminate phosphor include (Ba, Sr, Ca, Mg)$_2$Al$_{10}$O$_{17}$:(Eu, Mn) (GBAM type phosphor).

One kind of these may be used singly, or two or more kinds thereof may be used in combination.

Red Phosphor

As the red phosphor, the phosphor according to the present embodiment including a crystal phase having a composition represented by formula [1] or formula [2] above is used, but in addition to the phosphor according to the present embodiment, another phosphor of orange or red can be used such as a Mn-activated fluoride phosphor, a garnet-based phosphor, a sulfide phosphor, a nanoparticle phosphor, a nitride phosphor, and an oxynitride phosphor. As the another phosphor of orange or red, for example, the following phosphors can be used.

Examples of the Mn-activated fluoride phosphor include $K_2(Si, Ti)F_6:Mn$ and $K_2Si_{1-x}Na_xAl_xF_6:Mn$ (0<x<1) (collectively, KSF phosphors), examples of the sulfide phosphor may include, for example, (Sr, Ca)S:Eu (CAS phosphor) and $La_2O_2S:Eu$ (LOS phosphor), examples of the garnet-based phosphor include $(Y, Lu, Gd, Tb)_3Mg_2AlSi_2O_{12}:Ce$, examples of the nanoparticle include CdSe, and examples of the nitride or oxynitride phosphor include $(Sr, Ca)AlSiN_3$:Eu (S/CASN phosphor), $(CaAlSiN_3)_{1-x} \cdot (SiO_2N_2)_x$:Eu (CASON phosphor), $(La, Ca)_3(Al, Si)_6N_{11}$:Eu (LSN phosphor), $(Ca, Sr, Ba)_2Si_5(N, O)_8$:Eu (258 phosphor), $(Sr, Ca)Al_{1+x}Si_{4-x}O_xN_{7-x}$:Eu (1147 phosphor), $M_x(Si, Al)_{12}(O, N)_{16}$:Eu (where M is Ca, Sr, or the like) (α-sialon phosphor), $Li(Sr, Ba)Al_3N_4$:Eu (where the x above satisfies, in all cases, 0<x<1).

One kind of these may be used singly, or two or more kinds thereof may be used in combination.

Configuration of Light-Emitting Device

The light-emitting device according to the present embodiment includes the first light emitter (excitation light source) and can use, as the second light emitter, at least the phosphor according to the present embodiment including a crystal phase having a composition represented by formula [1] or formula [2] above, but the configuration of the light-emitting device is not limited, and any known device configuration can be used.

Examples of the device configuration and embodiments of the light-emitting device include those disclosed in JP2007-291352A, for example. In addition, the light-emitting device may be implemented as a cannonball type, a cup type, a chip-on-board, a remote phosphor, or the like.

Application of Light-Emitting Device

Applications of the light-emitting device are not particularly limited, and the light-emitting device can be used in various fields where a general light-emitting device is used, but a light-emitting device having high color rendering can be particularly suitably used as a light source for an illumination device or an image display device among those.

In addition, the light-emitting device including a red phosphor having a favorable emission wavelength can also be used in a red indicator lamp for a vehicle, or in a white light indicator lamp for a vehicle which includes the red.

Illumination Device

In one embodiment, the present invention can provide an illumination device including the light-emitting device as a light source.

In a case where the light-emitting device is applied to the illumination device, a specific configuration of the illumination device is not limited, and a light-emitting device such as those described above may be appropriately incorporated into a known illumination device and used. Examples thereof include a plane emission illumination device in which many light-emitting devices are lined up on a bottom surface of a holding case.

Image Display Device

In one embodiment, the present invention can provide an image display device including the light-emitting device as a light source.

In a case where the light-emitting device is used as the light source of the image display device, a specific configuration of the image display device is not limited, but use together with a color filter is preferred. For example, in a case of forming a color image display device using a color liquid crystal display element as the image display device, an image display device can be formed by setting the light-emitting device as a backlight, and combining an optical shutter using a liquid crystal with a color filter having red, green, and blue pixels.

Indicator Lamp for Vehicle

In one embodiment, the present invention can provide an indicator lamp for a vehicle including the light-emitting device as a light source.

In a specific embodiment, the light-emitting device used in the indicator lamp for a vehicle is preferably a light-emitting device radiating white light. In the light-emitting device radiating white light, light radiated from the light-emitting device preferably has a deviation duv (also referred to as "Δuv") from the blackbody radiation locus of a light color of −0.0200 to 0.0200 and a color temperature of 5,000 K or higher and 30,000 K or lower.

In a specific embodiment, the light-emitting device used in the indicator lamp for a vehicle is preferably a light-emitting device radiating red light. In this embodiment, for example, the light-emitting device may absorb blue light emitted from a blue LED chip and emit in red, thereby providing a red light indicator lamp for a vehicle.

The indicator lamp for a vehicle includes illumination provided to a vehicle for the purpose of providing some sort of indication to another vehicle, a person, or the like, such as a head lamp, a side lamp, a back lamp, a blinker, a brake lamp, or a fog lamp of a vehicle.

EXAMPLES

Hereinafter, some specific embodiments of the present invention will be described with reference to examples, but the present invention is not limited to the following unless the present invention departs from the gist thereof.

Measurement Method

[Measurement of Phosphor Composition]

Contents of Sr, Al, Ga, Eu, Li, and B in a phosphor sample were measured according to JIS K0116: 2014 by a high-frequency inductively coupled plasma optical emission spectrometry (ICP-OES) method in which the sample was subjected to pressurized acid decomposition in hydrochloric acid solution and diluted to an appropriate concentration. The contents of Sr, Al, Ga, and Eu were determined by an emission intensity ratio method using a Co standard solution as an internal standard, and the contents of Li and B were determined according to an emission intensity method by preparing a calibration curve of each element.

The content of N in the phosphor sample was measured with reference to 14.1 of JIS R1603:2007 (a of 8.2 of JIS R2015:2007, and the like by a method of pressurized acid decomposition, water vapor distillation separation, and neutralization titration. Note that a solution containing sulfuric acid and hydrogen fluoride was used for the pressurized acid decomposition.

Measurement of Emission Spectrum

The emission spectrum was measured with a phosphorescence spectrophotometer F-4500 (manufactured by Hitachi High-Tech Corporation) under the following measurement conditions.
Light source: xenon lamp
Excitation wavelength: 455 nm
Measurement wavelength range: 200 nm to 900 nm
Measurement interval: 0.2 nm, a value of a chromaticity coordinate was calculated based on emission spectrum data of 480 nm to 800 nm using a CIE 1931 XYZ equation function.

Measurement of Quantum Efficiency

The quantum efficiency was calculated based on an emission spectrum measured by a quantum efficiency measurement system QE-2100 (manufactured by Otsuka Electronics Co., Ltd.) under the following measurement conditions.
Light source: xenon lamp
Excitation wavelength: 455 nm
Measurement wavelength range: 200 nm to 850 nm
Measurement interval: 1.2 nm to 1.5 nm Examples 1 to 4

Nitride raw materials of the respective elements were mixed such that Sr:Li:Al:Ga:Eu=0.99:1:2.3:0.7:0.01 to obtain a phosphor raw material mixture. As the reaction vessel, a boron nitride (BN) crucible having a surface coated with Mo was prepared. The phosphor raw material mixture was placed in the reaction vessel, and the reaction vessel was sealed. The reaction vessel was placed in a heating furnace and baked for 5 hours at a maximum temperature of 845° C. under a nitrogen gas atmosphere, and as a result of a plurality of experiments, phosphors having different contents of B (boron) were obtained, and thus the phosphors were used as the phosphors according to Examples 1 to 4, respectively.

Comparative Example 1

A phosphor according to Comparative Example 1 was obtained in the same manner as in Example 1 except that a boron nitride (BN) crucible having a surface not coated with a metal was used as the reaction vessel.

Comparative Example 2

A phosphor according to Comparative Example 2 was obtained in the same manner as in Example 1 except that the maximum temperature for baking was set to 1,000° C.

Comparative Example 3

A phosphor according to Comparative Example 3 was obtained in the same manner as in Example 1 except that a molybdenum (Mo) crucible having a surface not coated with a metal was used as the reaction vessel and the maximum temperature for baking was set to 1,000° C.

Evaluation

As a result of specifying crystal structures of the obtained phosphors by powder X-ray diffraction, the phosphors according to Examples 1 to 4 and Comparative Example 1 exhibited favorable coincidence with a diffraction pattern of $SrLiAl_3N_4$ belonging to a space group P-1.

Table 1 shows production conditions of the phosphors according to Examples 1 to 4 and Comparative Examples 1 to 3, values of $Log_{10}(b)$, a relative emission intensity when emission intensity of Comparative Example 1 is set to 1.00 and other light emission characteristics, and Table 2 shows detailed results of composition analysis of the phosphors according to Examples 1 to 4 and Comparative Examples 1 to 3.

TABLE 1

| | Reaction vessel | Metal coating | Baking temperature/ ° C. | $Log_{10}(b)$ | Emission peak wavelength/ nm | FWHM/ nm | Relative emission intensity |
|---|---|---|---|---|---|---|---|
| Comparative Example 1 | BN | Absence | 845 | 3.70 | 638 | 57 | 1.00 |
| Example 1 | BN | Presence | 845 | 2.81 | 639 | 55 | 1.42 |
| Example 2 | BN | Presence | 845 | 2.11 | 638 | 56 | 2.08 |
| Example 3 | BN | Presence | 845 | 2.04 | 639 | 57 | 2.65 |
| Example 4 | BN | Presence | 845 | 0.48 | 643 | 51 | 6.73 |
| Comparative Example 2 | BN | Presence | 1,000 | 3.34 | 643 | 56 | 0.05 |
| Comparative Example 3 | Mo | Absence | 1,000 | <0.70 | 643 | 160 | 0.07 |

TABLE 2

| | Molar ratio of each element of phosphor (Al + Ga = 3.0) | | | | | | |
|---|---|---|---|---|---|---|---|
| | Sr | Eu | Li | Al | Ga | N | O |
| Comparative Example 1 | 0.958 | 0.010 | 0.838 | 2.312 | 0.688 | 3.997 | 0.233 |
| Example 1 | 0.967 | 0.010 | 0.929 | 2.330 | 0.670 | 4.007 | 0.236 |
| Example 2 | 0.945 | 0.010 | 0.955 | 2.320 | 0.680 | 3.889 | 0.147 |
| Example 3 | 0.991 | 0.011 | 1.007 | 2.307 | 0.693 | 4.035 | 0.137 |
| Example 4 | 0.937 | 0.005 | 0.961 | 2.317 | 0.683 | 3.903 | 0.196 |
| Comparative Example 2 | 0.942 | 0.010 | 0.792 | 2.296 | 0.704 | 3.450 | 0.161 |
| Comparative Example 3 | 0.933 | 0.010 | 0.875 | 2.309 | 0.691 | 3.423 | 0.128 |

Example 5

A phosphor according to Example 5 was obtained in the same manner as in Example 1 except that a phosphor raw material mixture obtained by mixing nitride raw materials of respective elements such that Sr:Li:Al:Eu=0.99:1:3.0:0.01 is satisfied was used, and a molybdenum (Mo) crucible having a surface not coated with a metal was used as the reaction vessel.

Example 6

A phosphor according to Example 6 was obtained in the same manner as in Example 5 except that a boron nitride (BN) crucible having a surface coated with Mo was used as the reaction vessel.

Comparative Examples 4 to 7

Phosphors according to Comparative Examples 4 to 7 were obtained in the same manner as in Example 5 except that a material of the crucible used for the reaction vessel, presence or absence of metal coating on a surface of the reaction vessel, and the maximum temperature for baking were changed as shown in Table 3.

Evaluation

Table 3 shows production conditions of the phosphors according to Examples 5 and 6 and Comparative Examples 4 to 7, values of $Log_{10}(b)$, a relative emission intensity when emission intensity of Comparative Example 7 is set to 1.00 and other light emission characteristics, and Table 4 shows detailed results of composition analysis of the phosphors according to Examples 5 and 6 and Comparative Examples 4 to 7.

TABLE 3

|  | Reaction vessel | Metal coating | Baking temperature/ °C. | $Log_{10}(b)$ | Emission peak wavelength/ nm | FWHM/ nm | Relative emission intensity |
|---|---|---|---|---|---|---|---|
| Example 5 | Mo | Absence | 845 | 0.48 | 651 | 53 | 1.49 |
| Example 6 | BN | Presence | 845 | 1.00 | 650 | 52 | 1.86 |
| Comparative Example 4 | BN | Absence | 1,000 | 4.21 | 649 | 50 | 0.33 |
| Comparative Example 5 | BN | Absence | 845 | 3.91 | 647 | 51 | 0.54 |
| Comparative Example 6 | Mo | Absence | 1,000 | 0.60 | 650 | 51 | 0.67 |
| Comparative Example 7 | BN | Presence | 1,000 | 2.00 | 649 | 51 | 1.00 |

TABLE 4

| | Molar ratio of each element of phosphor (Al + Ga = 3.0) | | | | | | |
|---|---|---|---|---|---|---|---|
| | Sr | Eu | Li | Al | Ga | N | O |
| Example 5 | 0.929 | 0.010 | 0.948 | 3.000 | 0.000 | 3.831 | 0.143 |
| Example 6 | 0.926 | 0.009 | 0.940 | 3.000 | 0.000 | 3.825 | 0.114 |
| Comparative Example 4 | 0.813 | 0.010 | 0.746 | 3.000 | 0.000 | 4.003 | 0.198 |
| Comparative Example 5 | 0.934 | 0.010 | 0.836 | 3.000 | 0.000 | 3.875 | 0.234 |
| Comparative Example 6 | 0.898 | 0.009 | 0.897 | 3.000 | 0.000 | 3.820 | 0.112 |
| Comparative Example 7 | 0.870 | 0.009 | 0.845 | 3.000 | 0.000 | 3.821 | 0.139 |

From Tables 1 to 4, it is understood that the phosphor according to the present embodiment is a red phosphor having a narrow peak full width at half maximum (FWHM) and high emission intensity.

FIGURE shows a graph in which a value of $Log_{10}(b)$ when a content of B (boron) in phosphors of Comparative Example 1 and Examples 1 to 4 is designated as b (mass ppm) is plotted on a horizontal axis, and relative luminance of the phosphors of Comparative Example 1 and Examples 1 to 4 when luminance of Comparative Example 1 is 1.0 is plotted on a vertical axis. From FIGURE, it is understood that the phosphor according to the present embodiment in which $Log_{10}(b)$ is 3.5 or less has high emission intensity.

Although various embodiments have been described above, it is needless to say that the present invention is not limited to such examples. It is clear that those skilled in the art can come up with various changes or modifications within the scope of the claims, and it is understood that these also naturally fall within the technical scope of the present invention. In addition, each of the constituent elements in the above embodiments may be freely combined without departing from the spirit of the invention.

Note that the present application is based on Japanese patent application No. 2023-016168 filed on Feb. 6, 2023, the content of which is incorporated by reference into the present application.

INDUSTRIAL APPLICABILITY

The present invention can provide a phosphor having a favorable emission peak wavelength, a narrow spectrum half width, and/or high emission intensity, and by using such a phosphor, a light-emitting device having favorable color rendering, color reproducibility, and/or conversion efficiency can be provided, so that the present invention can be applied to an illumination device, an image display device, and an indicator lamp for a vehicle.

The invention claimed is:
1. A phosphor, comprising:
a crystal phase having a composition represented by formula [1] below, wherein when a content of B (boron) is designated as b' (mass ppm), a value of $Log_{10}(b')$ is 3.5 or less,

$$Re_xMA_aMB_bMC_cD_dX_e \qquad [1]$$

(in formula [1] above,
MA includes Sr,
MB includes Li,
MC includes one or more elements selected from the group consisting of Al and Ga,
D is one or more elements selected from the group consisting of N (nitrogen) and O (oxygen), and includes N (nitrogen), X includes one or more elements selected from the group consisting of F, Cl, Br, and I, Re includes Eu, and a, b, c, d, e, and x satisfy the following expressions, respectively, $0.7 \leq a \leq 1.3$
$0.9 \leq b \leq 1.3$
$c = 3.0$
$3.2 \leq d \leq 4.8$
$0.0 \leq e \leq 0.2$
$0.0 < x \leq 0.2$).

2. A phosphor, comprising:

a crystal phase having a composition represented by formula [2] below, wherein when a content of B (boron) is designated as b' (mass ppm), a value of $\text{Log}_{10}(b')$ is 3.5 or less, $$\text{Re}_x\text{MA}_a\text{MB}_b(\text{Al}_{1-y}\text{MC}'_y)_c\text{D}_d\text{X}_e \quad [2]$$

(in formula [2] above,

MA includes Sr,

MB includes Li,

MC' includes Ga,

D is one or more elements selected from the group consisting of N (nitrogen) and O (oxygen), and includes N (nitrogen), X includes one or more elements selected from the group consisting of F, Cl, Br, and I, Re includes Eu, and a, b, c, d, e, x, and y satisfy the following expressions, respectively, $0.7 \leq a \leq 1.3$
$0.9 \leq b \leq 1.3$
$c = 3.0$
$3.2 \leq d \leq 4.8$
$0.0 \leq e \leq 0.2$
$0.0 < x \leq 0.2$
$0.0 < y \leq 1.0$).

3. The phosphor according to claim 1, wherein when the content of B (boron) is designated as b' (mass ppm), the value of $\text{Log}_{10}(b')$ is 3.0 or less.

4. The phosphor according to claim 1, wherein in the formula [1], 80 mol % or more of MA is Sr.

5. The phosphor according to claim 1, wherein in the formula [1], 80 mol % or more of MB is Li.

6. The phosphor according to claim 1, wherein in the formula [1], 80 mol % or more of MC consists of one or more elements selected from the group consisting of Al and Ga.

7. The phosphor according to claim 1, wherein in the formula [1], 80 mol % or more of MC is Al.

8. The phosphor according to claim 2, wherein in the formula [2], 80 mol % or more of MC' is Ga.

9. The phosphor according to claim 1, wherein in the formula [1], 80 mol % or more of Re is Eu.

10. The phosphor according to claim 1, wherein a space group of the crystal phase having the composition represented by the formula [1] is P-1.

11. The phosphor according to claim 1, wherein the phosphor has an emission peak wavelength in a range of 620 nm or more and 660 nm or less in an emission spectrum.

12. The phosphor according to claim 1, wherein a full width at half maximum (FWHM) in an emission spectrum is 70 nm or less.

13. A light-emitting device, comprising:

a first light emitter, and a second light emitter including at least one phosphor that emits visible light when irradiated with light from the first light emitter, wherein the second light emitter includes the phosphor according to claim 1.

14. The light-emitting device according to claim 13, wherein the second light emitter further includes a yellow phosphor and/or a green phosphor.

15. The light-emitting device according to claim 14, wherein the yellow phosphor and/or the green phosphor include any one or more of a garnet-based phosphor, a silicate-based phosphor, a nitride phosphor, and an oxynitride phosphor.

16. An illumination device, comprising; the light-emitting device according to claim 13 as a light source.

17. An image display device, comprising; the light-emitting device according to claim 13 as a light source.

18. An indicator lamp for a vehicle, comprising; the light-emitting device according to claim 13 as a light source.

19. The phosphor according to claim 2, wherein when the content of B (boron) is designated as b' (mass ppm), the value of $\text{Log}_{10}(b')$ is 3.0 or less.

20. The phosphor according to claim 2, wherein in the formula [2], 80 mol % or more of MA is Sr.

* * * * *